(12) United States Patent
Quek et al.

(10) Patent No.: US 6,252,290 B1
(45) Date of Patent: Jun. 26, 2001

(54) METHOD TO FORM, AND STRUCTURE OF, A DUAL DAMASCENE INTERCONNECT DEVICE

(75) Inventors: Shyue Fong Quek, Petaling Jaya (MY); Ting Cheong Ang, Singapore (SG); Lap Chan, San Francisco, CA (US); Sang Yee Loong, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/425,903

(22) Filed: Oct. 25, 1999

(51) Int. Cl.[7] ........................................ H01L 29/00
(52) U.S. Cl. ......................... 257/522; 257/758; 438/411
(58) Field of Search .................................. 257/522, 758, 257/759; 438/411, 412

(56) References Cited

U.S. PATENT DOCUMENTS

| | | | |
|---|---|---|---|
| 3,890,636 | * 6/1975 | Harada et al. . | |
| 5,117,278 | * 5/1992 | Thomas et al. . | |
| 5,324,683 | 6/1994 | Fitch et al. | 437/65 |
| 5,413,962 | 5/1995 | Lur et al. | 437/195 |
| 5,548,099 | 8/1996 | Cole, Jr. et al. | 219/121.69 |
| 5,559,055 | 9/1996 | Chang et al. | 437/195 |
| 5,670,828 | 9/1997 | Cheung et al. | 257/773 |
| 5,708,303 | 1/1998 | Jeng | 257/758 |
| 5,828,121 | * 10/1998 | Lur et al. . | |
| 5,882,963 | 3/1999 | Kerber et al. | 438/195 |
| 5,891,797 | 4/1999 | Farrar | 438/619 |
| 5,900,668 | 5/1999 | Wollesen | 257/522 |
| 6,078,088 | * 6/2000 | Buynoski . | |
| 6,143,641 | * 11/2000 | Kitch . | |
| 6,184,121 | * 2/2001 | Buchwalter et al. . | |

* cited by examiner

Primary Examiner—Sheila V. Clark
(74) Attorney, Agent, or Firm—George O. Saile; Rosemary L. S. Pike; Stephen G. Stanton

(57) ABSTRACT

A method of fabricating a dual damascene interconnect structure in a semiconductor device, comprises the following steps. A first level via photo sensitive dielectric layer is deposited and exposed over a semiconductor structure. A first level trench photo sensitive dielectric layer is deposited and exposed over the first via photo sensitive dielectric layer. The exposed first level via photo sensitive dielectric and trench photo sensitive dielectric layers are patterned and etched to form a first level dual damascene opening. The first level dual damascene opening comprises an integral first level via and metal line openings. A first level metal layer is deposited over the first level trench photo sensitive dielectric layer, filling the first level dual damascene opening. The first level metal layer is planarized to form at least one first level dual damascene interconnect having a first level horizontal metal line and a first level vertical via stack. The above steps are repeated n-1 times to form n-1 more dual damascene interconnects over the first level dual damascene interconnect where n is the number of interconnect levels desired. A passivation layer is deposited and patterned over the nth metal dual damascene interconnect layer to form openings in the passivation layer. The n number of via photo sensitive dielectric and trench photo sensitive dielectric layers are stripped and removed beneath the passivation layer openings and between the plurality of dual damascene structures wherein the portion of the via photo sensitive dielectric underneath the horizontal metal lines of the stripped trench photo sensitive dielectric layers remains.

19 Claims, 4 Drawing Sheets

METHOD TO FORM, AND STRUCTURE OF, A DUAL DAMASCENE INTERCONNECT DEVICE

FIELD OF THE INVENTION

The present invention relates generally to multilevel interconnects employed in semiconductor devices, and more specifically to increasing the speed of damascene interconnects in semiconductor devices.

BACKGROUND OF THE INVENTION

Although air gap design for interconnects in semiconductor devices having low-k (dielectric constant) and good RC time constant by replacing the interlayer silicon dioxide (dielectric constant k of about 4) with air (dielectric constant k of about 1), support is lacking on the via stack and metal line. This limits the number of metal layer interconnects that may be fabricated.

U.S. Pat. No. 5,559,055 to Chang et al. describes a method of decreasing the RC time constant by reducing the capacitance C by replacing the interlayer silicon dioxide (k=4) with air (k=1). Alternatively, the air space can also be filled with another low dielectric constant material in the range of about 2.2 to 3.4. In either case, the final effective dielectric constant of the device is lowered, thus lowering the RC time constant resulting in higher device speed.

U.S. Pat. No. 5,708,303 to Jeng describes a device and method of optimizing capacitance and performance for multilevel, damascene interconnects that may have air gaps between closely spaced metal interconnects. Crosstalk voltage is reduced by including a dielectric material having a higher permitivity between two metal layers to increase interlayer capacitance and inserting a low-dielectric constant material between metal lines.

U.S. Pat. No. 5,891,797 to Farrar describes a process of manufacturing integrated circuits for designing and implementing a hierarchical wiring system with the interconnection requirements sorted and designed into a particular wiring level according to length. Support structures, such as lateral ribs or intermediate posts fabricated of either insulating or conductive material, may be constructed to allow more flexibility in designing air bridge dimensions.

U.S. Pat. No. 5,882,963 to Kerber et al. describes a method of manufacturing a semiconductor component having capacitances occurring between contacts, interconnects, or metallizations reduced by filling cavities with air or gas. The cavities are produced between the semiconductor material and a passivation layer in a region wherein the interconnects are surrounded by dielectric and are subsequently closed by a further passivation layer.

U.S. Pat. No. 5,324,683 to Fitch et al. describes a method for forming an air region or an air bridge overlying a base layer to: provide for improved dielectric isolation of adjacent conductive layers; provide air-isolated conductive interconnects; and/or form many other microstructures or microdevices.

U.S. Pat. No. 5,548,099 to Cole, Jr. et al. describes a method for preserving an air bridge structure on an integrated circuit chip without sacrificing metallization routing area in an overlying high density interconnect structure. A protective layer is sublimed over the air bridge to provide mechanical strength while preventing contamination and deformation during processing.

U.S. Pat. No. 5,670,828 to Cheung et al. describes a semiconductor device with its control speed increased by forming air tunnels in the interwiring spaces of a conductive pattern to reduce intra-conductive layer capacitance.

U.S. Pat. No. 5,413,962 to Lur et al. describes a method of formation of a multilevel electrode metal structure and the interconnecting interlevel metal studs used in the fabrication of VLSI circuits. After the metal layers have been formed, the interlevel dielectric material used in forming the structure is etched away leaving air dielectric between the levels.

U.S. Pat. No. 5,900,668 to Wollesen describes a semiconductor device having reduced parasitic capacitance, and thus increased integrated circuit speed, by removing sections of dielectric interlayers which do not support conductive patterns to form air gaps which may be filled in with a dielectric material having a low dielectric constant.

SUMMARY OF THE INVENTION

Accordingly, it is an object of the present invention to provide a method of forming a dual damascene multilevel interconnect semiconductor device having air gaps between the inter- and intra-level metal lines to achieve a low RC time constant.

Another object of the present invention is to provide a method of forming a dual damascene multilevel interconnect semiconductor device utilizing air gaps to reduce the RC time constant and having polymer support under the metal line and adjacent the via stack permitting increased interconnect levels.

Other objects will appear hereinafter.

It has now been discovered that the above and other objects of the present invention may be accomplished in the following manner. Specifically, a method of fabricating a dual damascene interconnect structure in a semiconductor device, comprises the following steps. A first level via photo sensitive dielectric layer is deposited and exposed over a semiconductor structure. A first level trench photo sensitive dielectric layer is deposited and exposed over the first via photo sensitive dielectric layer. The exposed first level via photo sensitive dielectric and trench photo sensitive dielectric layers are patterned and etched to form a first level dual damascene opening. The first level dual damascene opening comprises an integral first level via and metal line openings. A first level metal layer is deposited over the first level trench photo sensitive dielectric layer, filling the first level dual damascene opening. The first level metal layer is planarized to form at least one first level dual damascene interconnect having a first level horizontal metal line and a first level vertical via stack. The above steps are repeated n-1 times to form n-1more dual damascene interconnects over the first level dual damascene interconnect where n is the number of interconnect levels desired. A passivation layer is deposited and patterned over the nth metal dual damascene interconnect layer to form openings in the passivation layer. The n number of via and trench photo sensitive dielectric layers are stripped and removed beneath the passivation layer openings and between the plurality of dual damascene structures wherein the portion of the via photo sensitive dielectric underneath the horizontal metal lines of the stripped trench photo sensitive dielectric layers remains. Air gaps are adjacent the at least one interconnect structure and are formed within the interlevel and intralevel layers.

BRIEF DESCRIPTION OF THE DRAWINGS

The features and advantages of the method of forming a dual damascene multilevel interconnect semiconductor device having air gaps between the inter- and intra-level metal lines according to the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

A summary of the steps for formation of a two level dual damascene structure in accordance with the preferred embodiment of the present invention is:

1) Coat and expose first via photo sensitive dielectric layer over a semiconductor structure;
2) Coat and expose first trench photo sensitive dielectric layer over first via photo sensitive dielectric layer;
3) Develop and etch exposed first via photo sensitive dielectric and trench photo sensitive dielectric layers to form a first dual damascene opening comprising a first via opening and a first metal line opening;
4) Deposit metal;
5) CMP metal to form first dual damascene formation;
6) Repeat steps 1) to 5) to form a second and subsequent dual damascene formations over the first dual damascene formation to form a dual damascene structure;
7) Deposit passivation layer over the uppermost dual damascene formation;
8) Pattern passivation layer to mask the dual damascene structure; and
9) Strip and remove the unmasked via and metal polymer photo sensitive dielectric layers to form air gaps adjacent the dual damascene formations leaving via photo sensitive dielectric underneath the horizontal metal lines of the dual damascene formations to support the dual damascene formations.

Figure 1A:
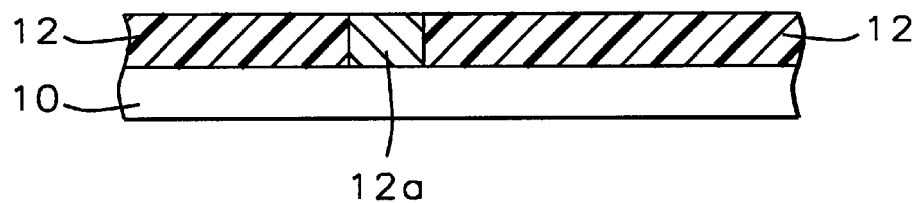
FIGS. 1A–1D, and 2 through 6 schematically illustrate in cross-sectional representation a preferred embodiment of the present invention.

Accordingly as shown in FIG. 1A, starting semiconductor structure 10 is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer. Unless otherwise specified, all structures, layers, etc. may be formed or accomplished by conventional methods known in the prior art.

The upper surface of semiconductor structure 10 can be comprised of a dielectric layer, e.g. ILD layer, an ILD layer with conductive plugs exposed, an intermetal layer (IMD), or an IMD layer with metal plugs or lines exposed.

Via photoresist (via PR), preferably a photo sensitive low dielectric constant (low-k) photo sensitive polymer comprised of TOK series, PEK series, or PFI series, and more preferably UV series, is coated on semiconductor structure 10 to a thickness of from about 2000 to 14,000 Å and more preferably from about 7000 to 10,000 Å in a resist spinner to form first via photo sensitive dielectric layer 12. The word "photoresist" should be used interchangeably with the word "dielectric." Via photo sensitive dielectric layer 12 is comprised of a photoresist or photo sensitive dielectric material that can resist the subsequent sputtering and CMP processes.

First via photo sensitive dielectric layer 12 can then be soft baked from about 75 to 100° C. for about 10 minutes to remove solvents and stress and to promote adhesion to semiconductor structure 10. First via photo sensitive dielectric layer 12 can have a dielectric constant from about 1.5 to 3.9, and more preferably from about 2.5 to 3.2. Via photo sensitive dielectric layer 12 refers to the photoresist layer used to define the lower via opening (e.g. 23) of a dual damascene opening. Via photo sensitive dielectric layer 12 may be a positive or negative photoresist layer.

The via photo sensitive dielectric layer structure is transferred to some type of illumination or exposure system where first via photo sensitive dielectric layer 12 is preferably exposed with a DUV/near UV wavelength of light at 12a (for a positive photoresist). First via photo sensitive dielectric layer 12 is not yet developed and etched.

Figure 1B:
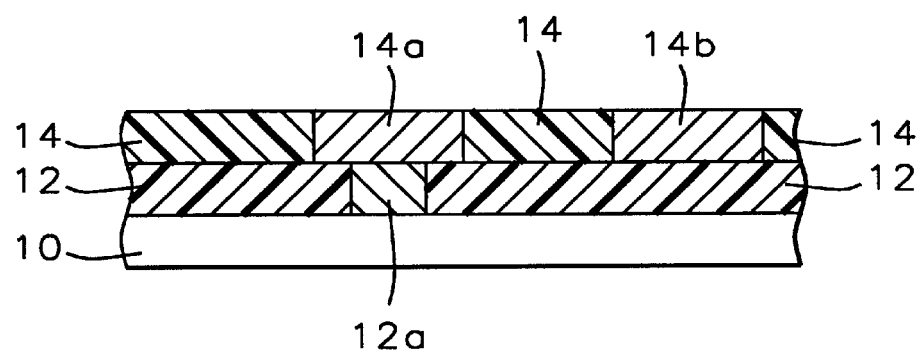

As shown in FIG. 1B, trench photo sensitive dielectric (metal PR), preferably a low-k photo sensitive polymer comprised of TOK series, PEK series, or PFI series, and more preferably UV series, is coated on first via photo sensitive dielectric layer 12 to a thickness of from about 2000 to 10,000 Å and more preferably from about 4000 to 7000 Å in a resist spinner to form first metal PR layer 14. Metal PR layer 14 is comprised of a photoresist or photo sensitive dielectric or polymeric material that can resist the subsequent sputtering and CMP processes.

First metal PR layer 14 can then be soft baked from about 75 to 100° C. for about 10 minutes to remove solvents and stress and to promote adhesion to first via photo sensitive dielectric layer 12. First metal PR layer 14 has a dielectric constant from about 1.5 to 3.9. Metal PR layer 14 refers to the photoresist layer used to define the upper metal line, or trench, opening (e.g. 25) of a dual damascene opening (e.g. 29), or metal line, or trench, opening (e.g. 27) of a single damascene opening (e.g. 18). Metal PR layer 14 may be a positive or negative photoresist layer.

The metal PR layer structure is transferred to some type of illumination or exposure system where first metal PR layer 14 is preferably exposed with a DUV/near UV wavelength of light at 14a and 14b (for a positive photoresist).

Figure 1C:
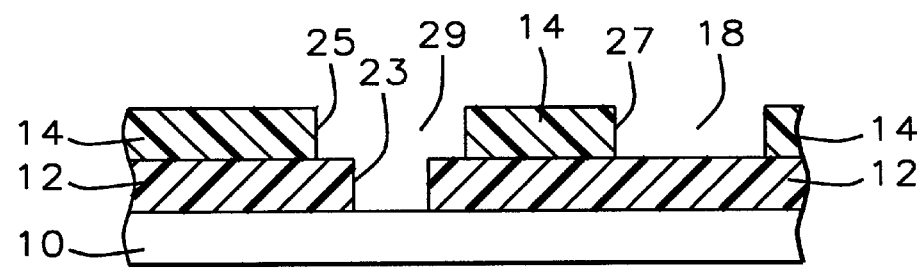

As shown in FIGS. 1B and 1C, the exposed first via and metal PR layers 12, 14, respectively, are then developed and etched (at 12a, 14a and at 14b for positive photoresist) to form lower via opening 23 in via photo sensitive dielectric layer 12; and upper metal line, or trench, opening 25 and metal line opening 27 in metal PR layer 14. Via opening 23 and metal line opening 25 form dual damascene opening 29, and metal line opening 27 forms single damascene opening 18.

PR layer 12 and metal PR layer 14 may be comprised of conventional photoresists, photo sensitive dielectrics, and photo sensitive polymers. These materials must be able to withstand the planarization processes.

Figure 2:
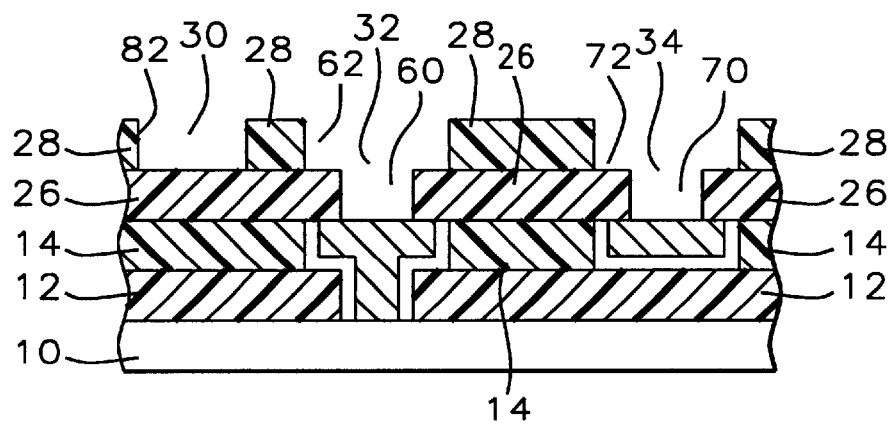
Figure 3:
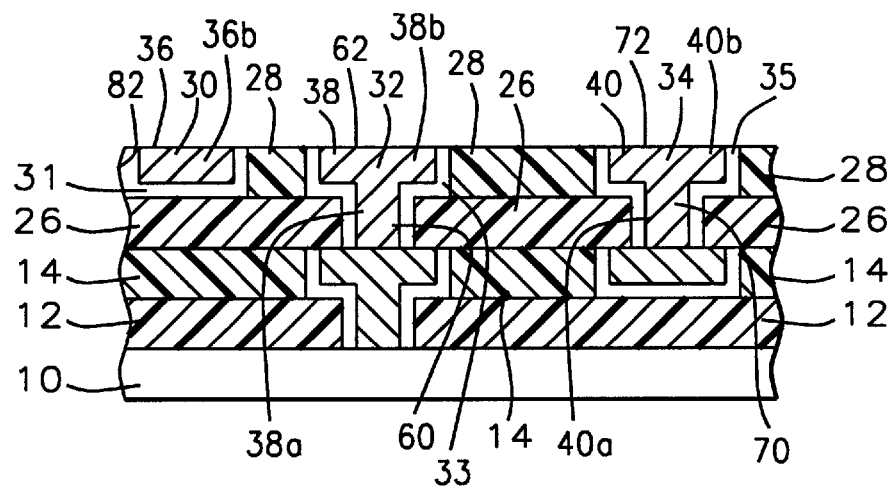

As shown in FIGS. 1C and 2, dual damascene opening (e.g. 29, 32, 34) consists of a via opening (e.g.. 23, 60, 70) and a metal line opening (e.g. 25, 62, 72). As shown in FIGS. 1C and 3, single damascene opening (e.g. 18, 30) consists of a metal line opening (e.g. 27, 82), respectively.

Figure 1D:
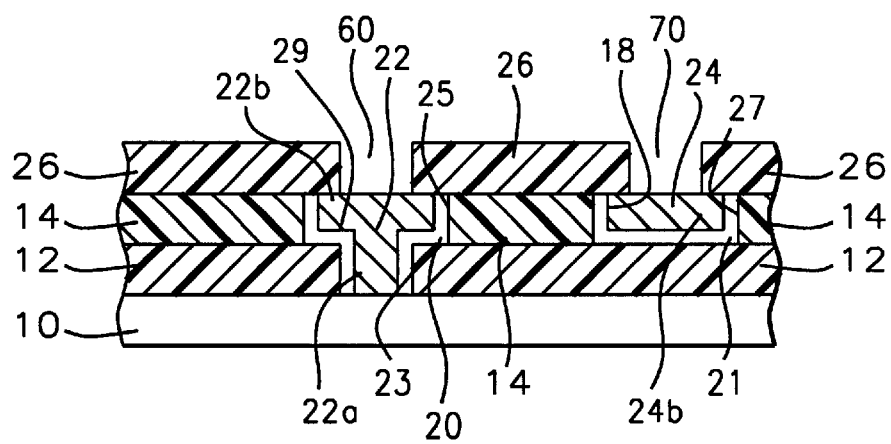

As shown in Fig. 1D, barrier layer 20, 21 comprised of TaN, TiN, Ta, TaSiN, TiN, or TiSiN may then be deposited, lining dual damascene opening 29 and single damascene opening 18. Barrier layers 20, 21 (and 31, 33, 35) are preferably formed by CVD or PVD at a low temperature below 200° C.

A seed layer (not shown) can be formed over barrier layer 20, 21. Metal, such as aluminum (Al), silver (Ag), aluminum copper alloy (AlCu), tungsten (W), or gold (Au) and preferably copper, is then deposited over exposed first metal PR layer 14, filling barrier lined dual damascene opening 29 and damascene opening 18. The metal layer is preferably copper (Cu) formed by electroplating. The word "metal" may be used interchangeably with the word "conductor." That is other conductive materials may be used in place of metals.

The metal is then planarized by chemical mechanical polishing (CMP) to form planarized first dual damascene interconnect 22 and single damascene interconnect 24. Dual damascene interconnect 22 includes via stack 22a and integral metal line 22b. Single damascene interconnect 24 includes only horizontal metal line 24b.

As shown in Figs. 1D, 2 and 3, the above steps are repeated to deposit and expose second via and metal PR layers 26, 28, respectively, which are then developed and etched to form dual damascene openings 32, 34 and single damascene opening 30. Dual damascene openings 32, 34 have lower via openings, or plug openings, 60, 70, respectively, and upper metal line openings, or trenches, 62, 72, respectively. Single damascene opening 30 has only metal line opening, or trench, 82.

Dual damascene openings 32, 34 and single damascene opening 30 can be lined with barrier layers 31, 33, 35, respectively. A seed layer (not shown) can be formed over barrier layers 31, 33, 35.

Metal (or other conductive material) is deposited over etched second metal PR layer 28 filling barrier lined dual damascene openings 32, 34 and single damascene opening 30, and is then planarized by CMP to form planarized second dual damascene interconnects 38, 40 having via stacks 38a, 40a, respectively, and integral metal lines 38b, 40b, respectively. The CMP planarization forms single damascene interconnect 36 having only metal line 36b at this level. (Further via and metal PR layers may be deposited, exposed, etched and filled with planarized metal to form additional dual damascene interconnects over second dual damascene interconnects 38, 40 and single damascene interconnect 36. For the purpose of illustration, only two layers of via and metal PR layers are formed.)

Figure 4:
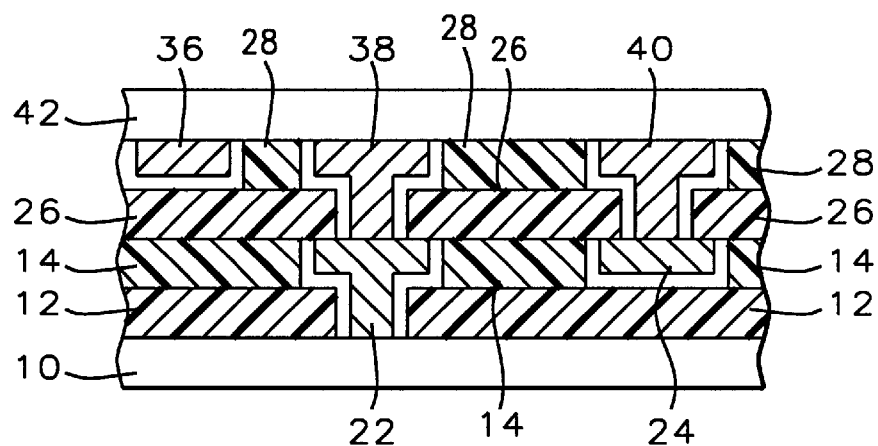

As shown in FIG. 4, passivation layer 42 is deposited over the uppermost interconnect layer, here the second interconnect layer, i.e. metal PR layer 28 and single damascene interconnect 36 and dual damascene interconnects 38, 40. Passivation layer 42 is comprised of $SiO_2$, SiON, or polyimide and is more preferably $Si_3N_4$ and has a thickness of from about 1000 to 10,000 Å, and more preferably from about 4000 to 8000 Å.

Figure 5:
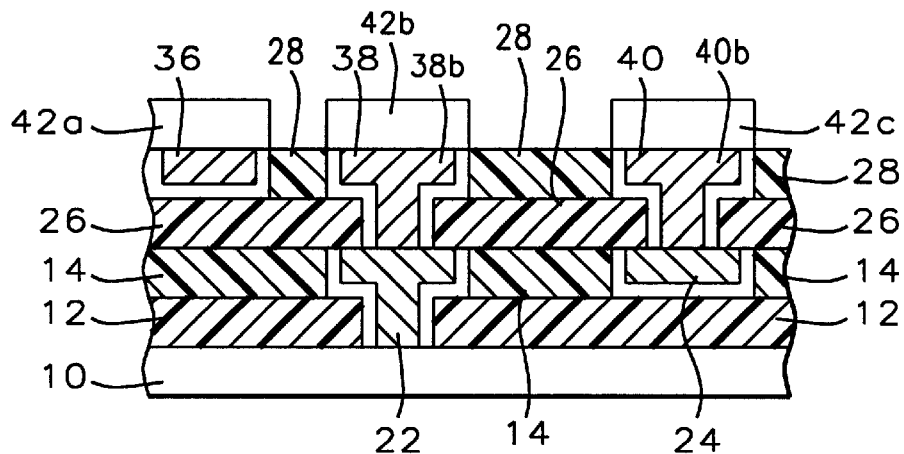

As shown in FIG. 5, passivation layer 42 is patterned to leave passivation layer portions 42a, 42b, 42c preferably over the uppermost horizontal metal line portions, here the horizontal metal lines 36b, 38b, 40b of single damascene interconnect 36 and dual damascene interconnects 38,40, respectively.

Figure 6:
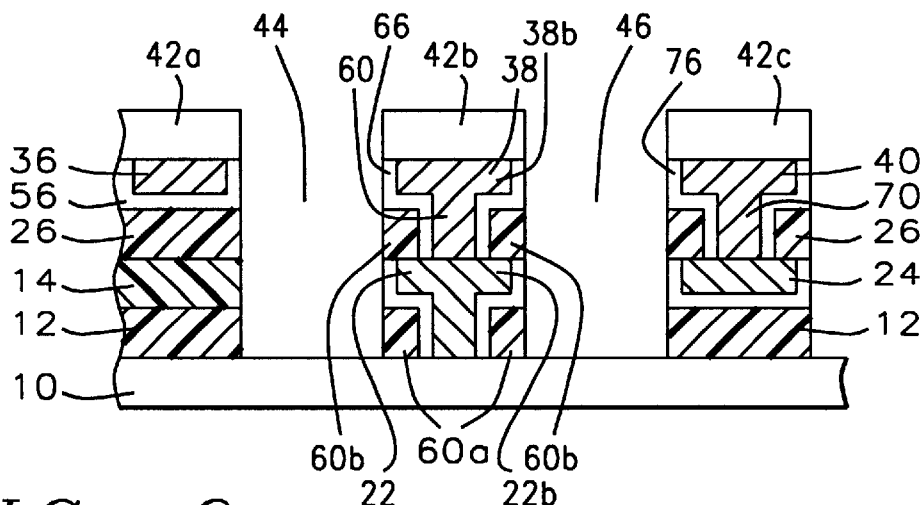

As shown in FIG. 6, first and second via photo sensitive dielectric layers 12, 26 and metal PR layers 14, 28 not masked by patterned passivation layer portions 42a, 42b, 42c are stripped and removed. Air gaps 44, 46 are thus formed adjacent interconnect structure 66 and between interconnect structure 66 and 56, and between interconnect structure 66 and 76. Since air gaps 44, 46 comprise air which has a dielectric constant of 1, the RC constant of the structure is reduced and thus the speed and performance of interconnect structure 66, for example, is improved.

Referring to interconnect structure 66, for example, the portions of via photo sensitive dielectric layers 12, 26 directly beneath horizontal metal lines 22b, 38b at 60a and 60b, respectively, and therefore masked from stripping, remain. Portions 60a, 60b add support to horizontal metal lines 22b, 38b, respectively, and strengthen and support interconnect structure 66 as a whole. Thus the interconnect structures (e.g. 56, 66, 76) formed in accordance with the present invention are strengthened.

For interconnect structures having additional interconnect levels, for example, 3, 4, and up to 12 levels are possible with the method and structure of the present invention because of the added support of the remaining via PR levels underneath the metal lines. The present invention permits higher levels than are otherwise allowable with previous methods of fabrication.

Figure 7:
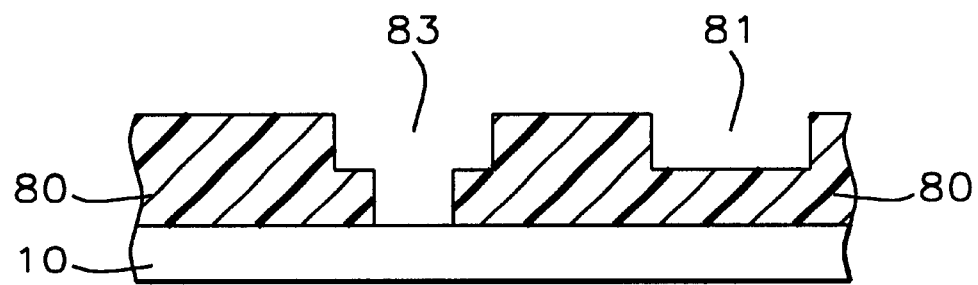
FIGS. 7 and 8 schematically illustrate in cross-sectional representation an alternate embodiment of the present invention.
Figure 8:
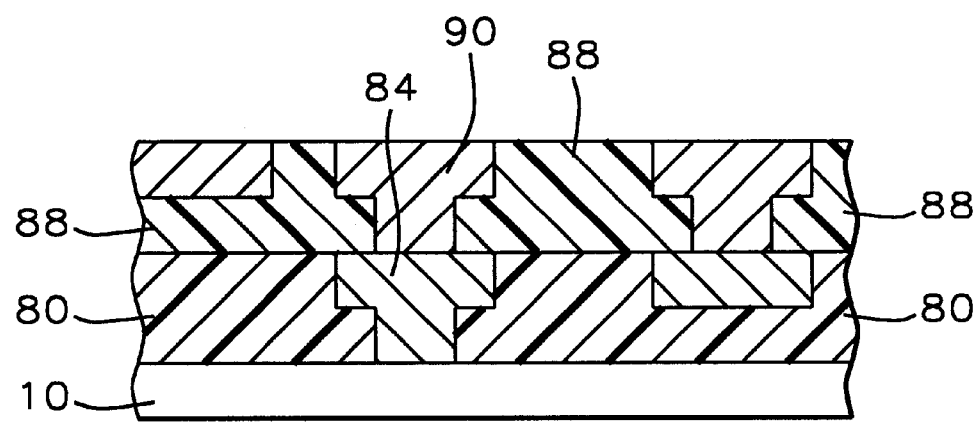

FIGS. 7 and 8 illustrate an alternate embodiment of the present invention in fabricating the desired levels of interconnects. In this alternate embodiment, a single layer of photoresist (PR layer) 80, 88 replaces the separate via and metal PR levels 12, 14 and 26, 28, respectively. That is, single PR layer 80 can be exposed, developed and etched to form single damascene opening 81, and dual damascene opening 83 by a method such as that described in U.S. Pat. No. 5,821,169 to Nguyen et al.

FIG. 8 illustrates a multilevel interconnect structure with 2 PR layers 80, 88 and two dual damascene interconnect levels 84, 90, for example. Although not shown, the structure of FIG. 8 can be covered with a passivation layer and processed (analogous to FIGS. 4 to 6) to form a structure analogous to that shown in FIG. 6.

Therefore, the via photo sensitive dielectric layers and metal PR layers 12, 14 shown in FIGS. 1A–1D can be a single PR layer 80 as shown in FIG. 7.

"Photoresist" in this patent application may comprise photo sensitive dielectrics, photo sensitive polymers, and conventional photoresists that can withstand planarization processes.

While particular embodiments of the present invention have been illustrated and described, it is not intended to limit the invention, except as defined by the following claims.

We claim:

1. A method of fabricating a dual damascene interconnect structure in a semiconductor device, comprising the steps of:
   a) depositing and exposing a first level via photo sensitive dielectric layer over a semiconductor structure;
   b) depositing and exposing a first level trench photo sensitive dielectric layer over said first via photo sensitive dielectric layer;
   c) patterning and etching said exposed first level via photo sensitive dielectric and trench photo sensitive dielectric layers to form a first level dual damascene opening; said first level dual damascene opening comprising an integral first level via and trench line openings;
   d) depositing a first level conductor layer over said first level trench photo sensitive dielectric layer, filling said first level dual damascene opening;
   e) planarizing said first level trench layer to form at least one first level dual damascene interconnect, said first level dual damascene interconnect having a first level horizontal conductor line and a first level vertical via stack;
   f) repeating steps a) to e) over said first level dual damascene interconnect n-1 times to form a dual damascene interconnect structure where n is the number of interconnect levels desired, and where a plurality of dual damascene structures may be formed having from n to n-1 levels of conductor dual damascene interconnects;
   g) depositing and patterning a passivation layer over said nth conductor dual damascene interconnect layer to form openings in said passivation layer; and h) selectively stripping and removing a predetermined number of said via photo sensitive dielectric and trench photo sensitive dielectric layers beneath said passivation layer openings and between said plurality of dual damascene structures wherein the portion of said via photo sensitive dielectric layer underneath said horizontal metal lines of said stripped trench photo sensitive dielectric layers remains.

2. The method of claim 1, wherein said first level and subsequent via photo sensitive dielectric layers have a thickness from about 7000 to 14,000 Å, and said first level and subsequent trench photo sensitive dielectric layers have a thickness from about 4000 to 7000 Å.

3. The method of claim 1, wherein said conductor is selected from the group comprising aluminum, copper, a copper alloy, an aluminum alloy, and tungsten.

4. The method of claim 1, further including the step of forming a barrier layer within said first level and subsequent level dual damascene opening before said metal layer deposition step, wherein said barrier layer is comprised of a conductor selected from the group TaN, TiN, Ta, and TaSiN.

5. The method of claim 1, wherein said passivation layer is comprised of a material selected from the dielectric group consisting of $Si_3N_4$, polyimide, $SiO_2$, phosphosilicate glass (PSG), borophosphosilicate glass (BPSG), SABPSAG, Undoped Silicate Glass (USG) and FSG.

6. The method of claim 1, wherein air gaps are formed between adjacent said plurality of dual damascene structures.

7. A method of fabricating a dual damascene interconnect structure in a semiconductor device, comprising the steps of:
   a) depositing and exposing a first level via photo sensitive dielectric layer, having a thickness from about 7000 to 14,000 Å, over a semiconductor structure;
   b) depositing and exposing a first level trench photo sensitive dielectric layer, having a thickness from about 4000 to 7000 Å, over said first via photo sensitive dielectric layer;
   c) patterning and etching said exposed first level via photo sensitive dielectric and trench photo sensitive dielectric layers to form a first level dual damascene opening; said first level dual damascene opening comprising an integral first level via and metal line openings;
   d) forming a barrier layer within said first level dual damascene opening;
   e) depositing a first level conductor layer over said first level trench photo sensitive dielectric layer, filling said first level dual damascene opening;
   f) planarizing said first level conductor layer to form at least one first level dual damascene interconnect, said first level dual damascene interconnect having a first level horizontal conductor line and a first level vertical via stack;
   g) repeating steps a) to f) over said first level metal dual damascene interconnect n-1 times to form a dual damascene interconnect structure where n is the number of interconnect levels desired, and where a plurality of dual damascene structures may be formed having from n to n-1 levels of metal dual damascene interconnects;
   h) depositing and patterning a passivation layer over said nth conductor dual damascene interconnect layer to form openings in said passivation layer; and i) selectively stripping and removing a predetermined number of said via photo sensitive dielectric and trench photo sensitive dielectric layers beneath said passivation layer openings and between said plurality of dual damascene structures wherein the portion of said via photo sensitive dielectric underneath said horizontal metal lines of said stripped trench photo sensitive dielectric layers remains.

8. The method of claim 7, wherein said conductor is selected from the group comprising aluminum, copper, a copper alloy, an aluminum alloy, and tungsten.

9. The method of claim 7, wherein said barrier layer is comprised of a conductor selected from the group TaN, TiN, Ta, TaSiN, and TiW.

10. The method of claim 7, wherein said passivation layer is comprised of a material selected from the group consisting of $Si_3N_4$, $SiO_2$, PSG, BPSG, SABPSAG, TEOS Oxide, BPTEOS, USG and FSG.

11. The method of claim 7, wherein air gaps are formed between adjacent said plurality of dual damascene structures.

12. A method of fabricating a dual damascene interconnect structure in a semiconductor device, comprising the steps of:
   a) spinning on, exposing, developing and ashing a first level photo sensitive dielectric layer over a semiconductor structure to form a first level dual damascene opening; said first level dual damascene opening comprising an integral first level via and metal line openings;
   b) depositing a first level conductor layer over said first level photo sensitive dielectric layer, filling said first level dual damascene opening;
   c) planarizing said first level conductor layer to form at least one first level dual damascene interconnect, said first level dual damascene interconnect having a first level horizontal conductor line and a first level vertical via stack;
   d) repeating steps a) to c) over said first level dual damascene interconnect n-1 times to form a dual damascene interconnect structure where n is the number of interconnect levels desired, and where a plurality of dual damascene structures may be formed having from n to n-1 levels of metal dual damascene interconnects;
   e) depositing and patterning a passivation layer over said nth metal dual damascene interconnect layer to form openings in said passivation layer; and
   f) selectively stripping and removing a predetermined number of said via photo sensitive dielectric and trench photo sensitive dielectric layers beneath said passivation layer openings and between said plurality of dual damascene structures wherein the portion of said via photo sensitive dielectric underneath said horizontal conductor lines of said stripped trench photo sensitive dielectric layers. remains.

13. An interconnect structure in a semiconductor device comprising;
   a semiconductor layer;
   at least one interconnect structure comprising a plurality of interconnects above said semiconductor layer; each said interconnect having a horizontal conductor line and a vertical via stack;
   air gaps adjacent said at least one interconnect structure, said air gaps formed within the interlevel and intralevel layers; and
   polymer supports under said conductor lines and adjacent said via stacks of said interconnects;
   whereby said polymer supports support and strengthen said at least one interconnect structure.

14. The interconnect structure of claim 13, wherein said interconnects are dual damascene interconnects.

15. The interconnect structure of claim 13, wherein said polymer supports are comprised of a material selected from the group consisting of UV photoresist series, PFI photoresist series, and polymer low-k dielectric like BCB, parylene, HSQ, MSQ and XEROGEL.

16. The interconnect structure of claim 13, wherein said plurality of interconnects are comprised of aluminum, copper, a copper alloy, aluminum, an aluminum alloy, tungsten.

17. The interconnect structure of claim 13, wherein said polymer supports are comprised of a low-k material having a dielectric constant of between about 1.5 and 3.9.

18. The interconnect structure of claim 13, wherein said polymer supports are comprised of a low-k material having a dielectric constant of between about 2.5 and 3.2.

19. An interconnect structure in a semiconductor device comprising;

a semiconductor layer;

at least one interconnect structure comprising a plurality of dual damascene copper interconnects above said semiconductor layer; each said dual damascene copper interconnect having a horizontal conductor line and a vertical via stack;

air gaps adjacent said at least one interconnect structure, said air gaps formed within the interlevel and intralevel layers; and polymer supports under said conductor lines and adjacent said via stacks of said dual damascene copper interconnects;

whereby said polymer supports support and strengthen said at least one interconnect structure.

* * * * *